United States Patent [19]
Thurgate et al.

[11] Patent Number: 6,049,479
[45] Date of Patent: Apr. 11, 2000

[54] OPERATIONAL APPROACH FOR THE SUPPRESSION OF BI-DIRECTIONAL TUNNEL OXIDE STRESS OF A FLASH CELL

[75] Inventors: Timothy Thurgate, Sunnyvale; Daniel Sobek, Portola Valley, both of Calif.

[73] Assignee: Advanced Micro Devices, Inc., Sunnyvale, Calif.

[21] Appl. No.: 09/404,080

[22] Filed: Sep. 23, 1999

[51] Int. Cl.[7] .................................................. G11C 16/04
[52] U.S. Cl. .............................. 365/185.18; 365/185.29; 365/185.33; 365/218
[58] Field of Search ........................ 365/185.18, 185.29, 365/185.33, 218

[56] References Cited

U.S. PATENT DOCUMENTS 5,828,605   10/1998   Peng et al. ..................... 365/185.29
5,959,891   9/1999    Sansbury ........................ 365/185.29

*Primary Examiner*—Trong Phan
*Attorney, Agent, or Firm*—H. Donald Nelson

[57] ABSTRACT

A method of erasing a flash memory cell to suppress bi-directional tunnel oxide stress that includes applying a negative voltage to the control gate of the flash memory cell, applying a bias voltage to the substrate of the flash memory cell and applying a bias voltage to the drain of the flash memory cell that equals the bias voltage applied to the substrate minus a fraction of a diode voltage drop across the drain junction formed between the drain and the substrate. The bias voltage applied to the drain is selected so that the drain junction is not forward biased. The fraction is in the range of 20% to 80% of the diode voltage drop.

3 Claims, 3 Drawing Sheets

PROGRAM

EDGE ERASE

_US 6,049,479_

OPERATIONAL APPROACH FOR THE SUPPRESSION OF BI-DIRECTIONAL TUNNEL OXIDE STRESS OF A FLASH CELL

BACKGROUND OF THE INVENTION

1. Field of the Invention

This invention relates generally to floating gate semiconductor memory devices such as EEPROMs. More specifically, this invention relates to an operational method to suppress bi-directional tunnel oxide stress in a flash cell.

2. Discussion of the Related Art

A class of non-volatile memory devices known as "flash" EEPROM (Electrically Erasable Programmable Read Only Memory) devices combines the advantages of EPROM density with the electrical erasability of an EEPROM. One feature that distinguishes flash EEPROM memory cells from standard EEPROM memory cells is that unlike standard EEPROM memory cells, flash EEPROM memory cells do not contain a select transistor on a one-for-one basis with each floating gate memory cell. A select transistor is a transistor that allows the selection of an individual memory cell within the memory device and is used to selectively erase a specific memory cell. Because flash EEPROMs do not have a select transistor for each floating gate transistor, flash EEPROM memory cells cannot be individually erased and therefore must be erased in bulk, either by erasing the entire chip or by erasing paged groups or banks of cells. Elimination of the select transistor allows for smaller cell size and gives the flash EEPROM an advantage in terms of manufacturing yield (in terms of memory capacity) over comparably sized standard EEPROMs.

Typically, a plurality of flash EEPROM cells is formed on a semiconductor substrate, which is also known as a silicon wafer. FIG. 1 illustrates a single conventional flash EEPROM memory cell having a double-diffused source region. As shown in FIG. 1, flash memory cell 100 is formed on a p-type substrate 110 and includes an n type double-diffused source region 102 and an n+ drain region 104. A substrate electrode 126 is attached to the substrate 110. The drain region 104 and the source region 102 are spaced apart from each other forming a channel region 122. A source electrode 114 and a drain electrode 112 are connected to the source region 102 and the drain region 104, respectively.

The double-diffused source region 102 is formed of a lightly doped n region 128 (phosphorous doped) and a more heavily doped but shallower n+ region 130 (arsenic doped) embedded within the deep n region 128. The phosphorus doping within n region 128 reduces the horizontal electric ($E_H$) field 134 between the source region 102 and the substrate 110.

The floating gate 106 is disposed a short distance above the source region 102 and the drain region 104 over a dielectric layer 118. Above the floating gate 106 and disposed over the dielectric layer 116 is a control gate 108. A control gate electrode 120 is attached to control gate 108. The dimension $L_{GATE}$ 132 represents the gate length for the gates contained in flash memory cell 100.

In a conventional method of operation, the programming of a flash EEPROM memory cell is achieved by inducing "hot electron" injection from a section of the channel 122 near the drain 104 into the floating gate 106. The injected electrons cause the floating gate 106 to carry a negative charge. Grounding the source region 102, biasing the control gate 108 to a relatively high positive voltage and biasing the drain region 104 to a moderate positive voltage induce the hot electrons.

For example, to program the flash memory cell 100, the source electrode 114 is connected to ground, the drain electrode 112 is connected to a relatively high voltage (typically +4 volts to +9 volts) and the control gate electrode 120 is connected to a relatively high voltage level (typically +8 volts to +12 volts). Electrons are accelerated from source region 102 to drain region 104 via the channel 122 and the "hot electrons" are generated near the drain region 104. Some of the hot electrons are injected through he relatively thin gate dielectric layer 118 and become trapped in the floating gate 106 thereby giving floating gate 106 a negative potential.

After sufficient negative charge accumulates on floating gate 106, the negative potential of floating gate 106 raises the threshold voltage of the stacked gate transistor and inhibits current flow through the channel 122 during a subsequent "read" mode. The magnitude of the read current is used to determine whether a memory cell has been programmed.

Conversely, to erase a flash memory device, electrons are typically driven out of the floating gate 106 by biasing the control gate 108 to a large negative voltage and biasing the source region 102 to a low positive voltage in order to produce a sufficiently large vertical electric field ($E_V$) 136 in the tunnel oxide. The large vertical field ($E_V$) 136 in the tunnel oxide produces Fowler-Nordheim (F-N) tunneling of electrons stored in the floating gate 106 through the tunnel oxide into the source region 102. The charge removed from the floating gate 106 produces a threshold voltage shift.

For example, during erasure a relatively low positive voltage (typically from +0.5 volts to +5 volts) is applied to source electrode 114 and a relatively large negative voltage (typically from −7 volts to −13 volts) is applied to control gate electrode 120. The voltage of the substrate electrode 126 is grounded and the drain electrode 112 is allowed to float. The vertical electric filed ($E_V$) 136 established between the control gate 108 and the source region 102 induces electrons previously stored in floating gate 106 to pass through dielectric layer 118 and into source region 102 by way of Fowler-Nordheim tunneling.

In order to produce a sufficient electric field in the tunnel oxide, it is typically necessary to bias the control gate 108 to a large enough negative voltage such that the floating gate 106 reaches a voltage of approximately −5.5 volts. A typical potential difference $V_{SF}$ between the source region 102 and floating gate 106 is on the order of 10 volts and accordingly, when the source voltage $V_S$ is made less positive, the control gate voltage $V_{CG}$ should be made more negative. Once the source to floating voltage $V_{SF}$ is selected, the remaining factors are preferably constrained according to the equation:

$$V_{FG} = \alpha_{CG}(V_{CG} - \Delta V_T) + \alpha_S V_S + \alpha_B V_B$$

where:
- $V_{FG}$=the floating gate voltage;
- $V_{CG}$=the control gate voltage;
- $V_s$=the source voltage;
- $V_B$=the substrate or p-well bias;
- $\Delta V_T$=the threshold voltage difference arising from negative charge added to the floating gate as measured from the control gate;
- $\alpha_{CG}$=the capacitive coupling coefficient from the control gate to the floating gate;
- $\alpha_s$=the capacitive coupling coefficient between the source and the floating gate;
- $\alpha_B$=the capacitive coupling coefficient between the substrate or p-well and the floating gate.

As technology advances, a continuing goal throughout the industry is to increase the density of memory devices. By reducing the size of a flash EEPROM device a greater memory capacity can be achieved. As can be appreciated, the more die per wafer, the cost per die can be reduced. In addition, using higher density memory devices may provide for a reduction in the overall power consumption.

In order to increase the memory density of flash EEPROM devices, the memory cells are typically scaled down in size, for example the reduction in overall footprint of the device, is accomplished by reducing the gate length ($L_{GATE}$) 132 and the gate width ($W_{GATE}$) 138. However, a problem with reducing the length of the memory cell gates is that the distance between the source region 102 and the drain region 104 must also be reduced. As the source region 102 approaches the drain region 104, the lateral diffusion from the phosphorous in the source region 128 causes a leakage between the source region 102 and the drain region 104 resulting in detrimental short channel effects. Short channel effects produce serious problems in the flash memory cells and are typically evident when the gate length ($L_{GATE}$) 132 is reduced below 0.4 microns.

One method for reducing the short-channel effect would be to eliminate the double-diffused phosphorous region 128. By using a single-diffused source region, the phosphorous diffusion overlap distance $L_{DD}$ 124 would no longer present and the short channel effect problem would be significantly reduced. Eliminating the phosphorous diffusion overlap distance $L_{DD}$ 124 would allow for a gate length ($L_{GATE}$) reduction below 0.4 microns and would provide for an increased packing density of the memory cells.

However, eliminating the phosphorous doped N region 128 produces the unwanted side effect of increasing the horizontal electric ($E_H$) field 134 in the pn junction between the source region 102 and the substrate 110 during erasure of the memory cell. This increase in the horizontal electric ($E_H$) field 134 contributes to an increase in the band-to-band current since it is generally accepted that:

$$J_{b-t-b} = A_{b-t-b} f(E) \, e^{-(B_{b-t-b}/E)}$$

where:

$J_{b-t-b}$=band-to-band current density (amps/cm$^2$)

$A_{b-t-b} B_{b-t-b}$=constants $f(E)$ sometimes modeled as $E^2$

E=SQRT ($E_V^2 + E_H^2$) (the tunneling field in the junction).

Because of the source-to-substrate biasing during the erasure of the memory cell device, a reversed-biased pn junction is formed that produces band-to-band currents (also known as Zener currents) in the source junction. The band-to-band currents are normally several orders of magnitude larger than the Fowler-Nordheim current. This band-to-band current is hard to sustain from a circuit design point of view and is also believed to generate detrimental reliability problems such as hole trapping in the tunnel oxide.

There are at least three detrimental effects caused by hole trapping. The first is that hole trapping can potentially affect the floating gate's ability to retain a negative charge (electrons) as the trapped holes have a tendency to migrate to the floating gate 106 and to neutralize the negative charge therein. The production of the holes at the surface of the dielectric 118 below the floating gate 106 is undesirable as it can interfere with reliable programming, reading and erasure of randomly located memory cells, known as the gate disturb phenomenon. This gate disturb phenomenon occurs because holes trapped in the tunnel oxide layer tend to migrate upwardly into the floating gate 106 to neutralize negative program charges and thus decrease the charge retention time of the floating gate 106.

The second detrimental effect caused by hole trapping is that holes can be injected into the tunnel oxide 118 and may damage the tunnel oxide 118 to such an extent that there may be created a leakage path along aligned traps between the floating gate 106 and source region 102 or substrate 110 thus reducing the effective thickness of the tunnel oxide.

The third detrimental effect caused by hole trapping is that hole trapping modulates the effective field in the oxide, that is, it reduces the field that possibly changes the erase characteristics through the lifetime of the device. This effect is more important for channel erase since for edge erase the Fowler-Nordheim tunneling region is designed to be away from the band-to-band tunneling region.

More specifically, during erasure some memory cells may produce more hot holes than others and, consequently, some floating gates will be discharged faster than others. This creates a non-uniform erasure throughout the memory chip. Holes that do not migrate to the floating gate 106 during erasure can remain in the dielectric 118 for random periods of time. These holes can later migrate into the floating gate 106 after the memory cell has been programmed and neutralize part of the programming charge that is to be retained.

In addition to the detrimental hole trapping, the band-to-band currents require additional current from the memory chip charge pumps. Because the movement in the industry has generally been to reduce the supply voltage for memory chips, the charge pump efficiency has also been reduced and therefore cannot support the band-to-band currents. Under this condition, the source bias is decreased thus reducing the cell erase speed.

FIG. 2 shows the flash memory cell 100 being programmed. The control gate 108 is biased to a positive voltage between 8–12 volts, the drain 104 is biased to a positive voltage between 4–9 volts and the source 102 is connected to ground. As discussed above, electrons are accelerated from the source 102 as indicated by arrow 200 and hot electrons have enough energy to transition across the tunnel oxide 118 into the floating gate 106. It is noted that the electrons transition through the tunnel oxide 118 in a region close to the drain.

FIG. 3 shows the flash memory cell 100 being erased in a procedure known as an edge erase procedure. The control gate 108 is biased to a negative voltage between −7 to −13 volts, the drain 104 is floated and the source is biased to a positive voltage between 0.5 to 5 volts. As discussed above, electrons transition from the floating gate 106 to the source 102 by Fowler-Nordheim tunneling. It is noted that the electrons transition from the floating gate 106 to the source 102 in the region in which the floating gate 106 overlaps the source 102.

FIG. 4 shows the flash memory cell 100 showing the respective regions affected during an edge erase procedure and a programming procedure. In addition, the memory cell 100 is shown having the double diffused source region 128. During edge erase, the electrons transition to the source region in the region in which the floating gate 106 overlaps the source 102. The hot electrons transition to the floating gate 106 near the region of the drain 104. It is noted that the distance $L_1$ defines the channel length. The distance between the heavily doped source region 130 is denoted by $L_2$. Because it is necessary to maintain the minimum channel length $L_1$ the necessity to have a double diffused source limits the amount the memory cell can be shrunk. In addition, the double diffused source requires an asymmetric source/drain structure and higher source doping.

FIG. 5 shows the flash memory cell 100 showing the respective regions affected during a channel erase procedure and a programming procedure and showing the bi-directional stress area in the memory cell. It should be appreciated that the programming procedure and the erase procedure are not done simultaneously and that FIG. 5 only shows the superimposition of the programming procedure and the erase procedure. The advantage of a channel erase procedure is that lower currents, on the order of 1 μamp or less per half-million cell sector, can be used to erase the flash device as compared to several milliamps per half-million cell sector. As shown, the channel length $L_c$ is less than the channel length $L_1$ shown in FIG. 4. During a channel erase procedure, electrons transition from the floating gate 106 to the channel along the entire length of the channel defined between the source 102 and the drain 104. During programming, the hot electrons transition the tunnel oxide from the channel region near the drain into the floating gate 106. As is known in the flash memory art, the electrons transitioning through the tunnel oxide 118 may create interface states at the silicon/tunnel oxide interface and damage the bulk oxide. The cumulative effect of the tunnel oxide stress causes a decrease in the lifetime and reliability of the flash memory device. When there is an overlap of the regions in which erase electrons and programming electrons transition the tunnel oxide there is a bi-directional stress area. Such a bi-directional stress area is indicated at 500.

Therefore, what is needed is a method of operating the flash memory device that prevents the occurrence of bi-directional tunnel oxide stress areas in the flash memory cell.

SUMMARY OF THE INVENTION

According to the present invention, the foregoing and other objects and advantages are achieved by a method of erasing a flash memory cell that suppresses the bi-directional tunnel oxide stress of the flash memory cell.

In accordance with an aspect of the invention, a negative voltage is applied to the control gate of the flash memory cell, a bias voltage is applied to the substrate of the flash memory cell and a bias voltage is applied to the drain of the flash memory cell that is equal to the bias voltage applied to the substrate minus a fraction of a diode voltage drop across the drain junction.

In accordance with another aspect of the invention, the bias voltage applied to the drain junction so that the drain junction is not forward biased.

In accordance with another aspect of the invention, the fraction is in the range of 20% to 80%.

The described method thus provides a method of erasing a flash memory cell that suppresses bi-directional tunnel oxide stress in the flash memory cell.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to a specific embodiment of the present invention that illustrates the best mode presently contemplated by the inventors for practicing the invention.

Figure 1:
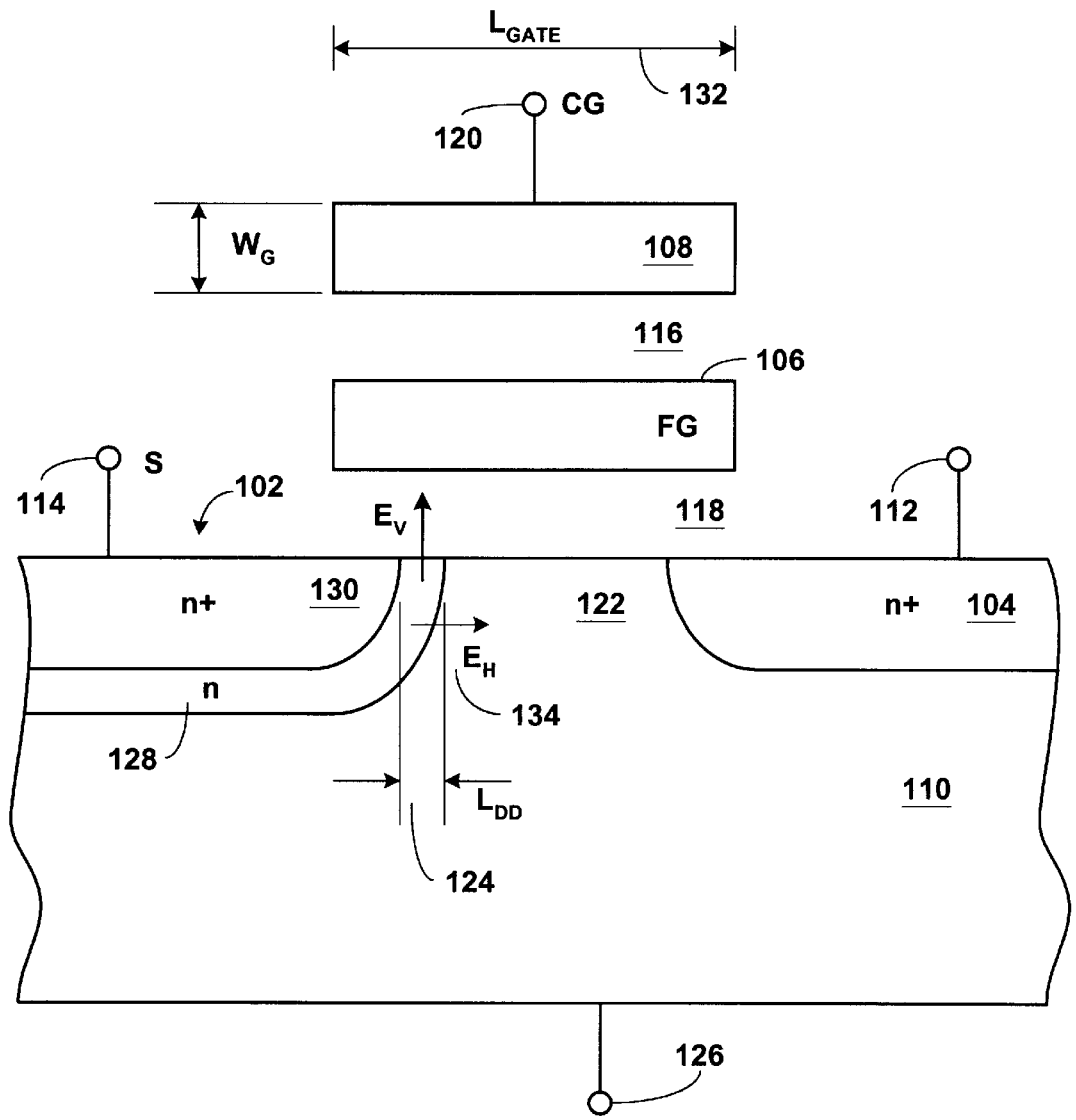
FIG. 1 shows a flash memory cell having double diffused source, a drain, a floating gate and a control gate.
Figure 2:
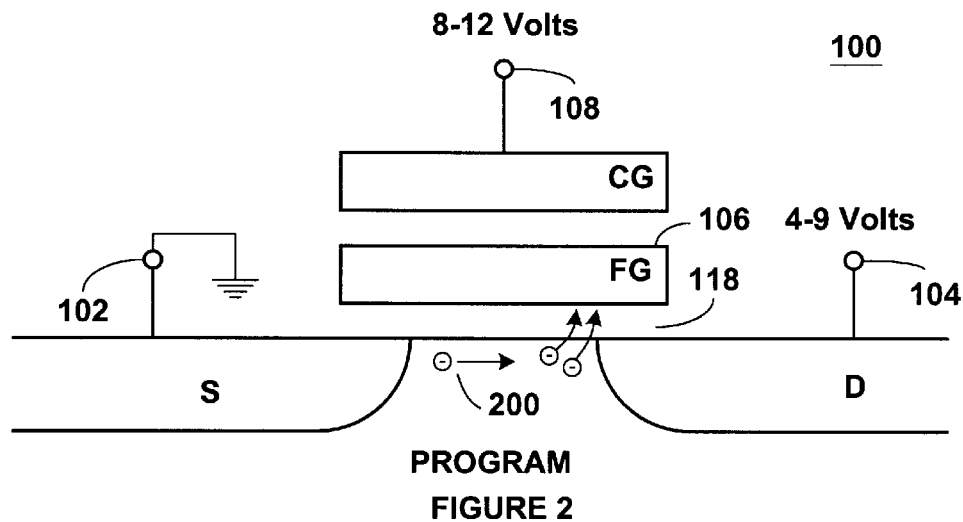
FIG. 2 shows the bias voltages and the movement of electrons in the flash memory cell shown in FIG. 1 during programming.
Figure 3:
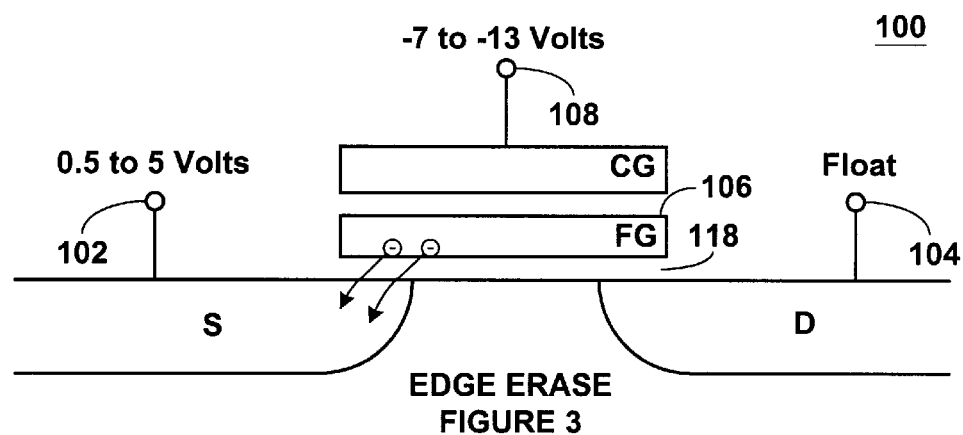
FIG. 3 shows the bias voltages and the movement of electrons in the flash memory cell shown in FIG. 1 during edge erase.
Figure 4:
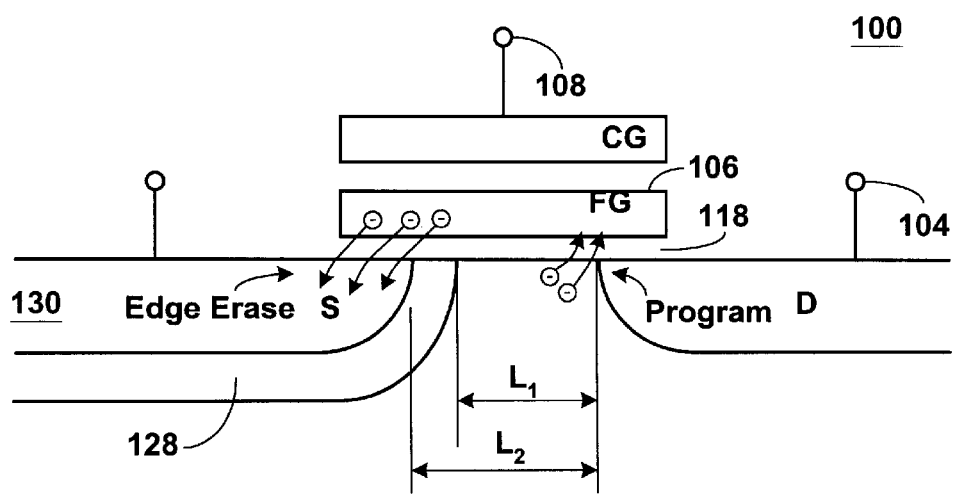
FIG. 4 shows the movement of electrons in the flash memory cell shown in FIG. 1 during both edge erase and programming.
Figure 5:
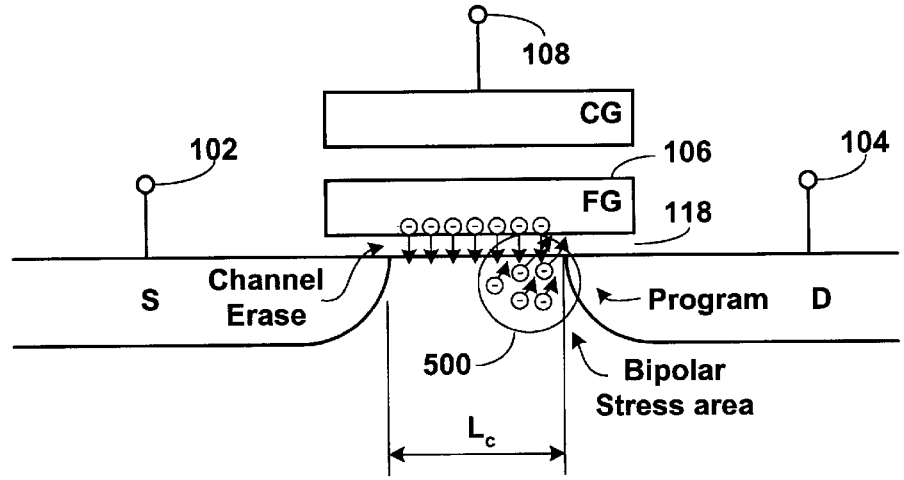
FIG. 5 shows the movement of electrons in a flash memory cell during channel erase and programming.
Figure 6:
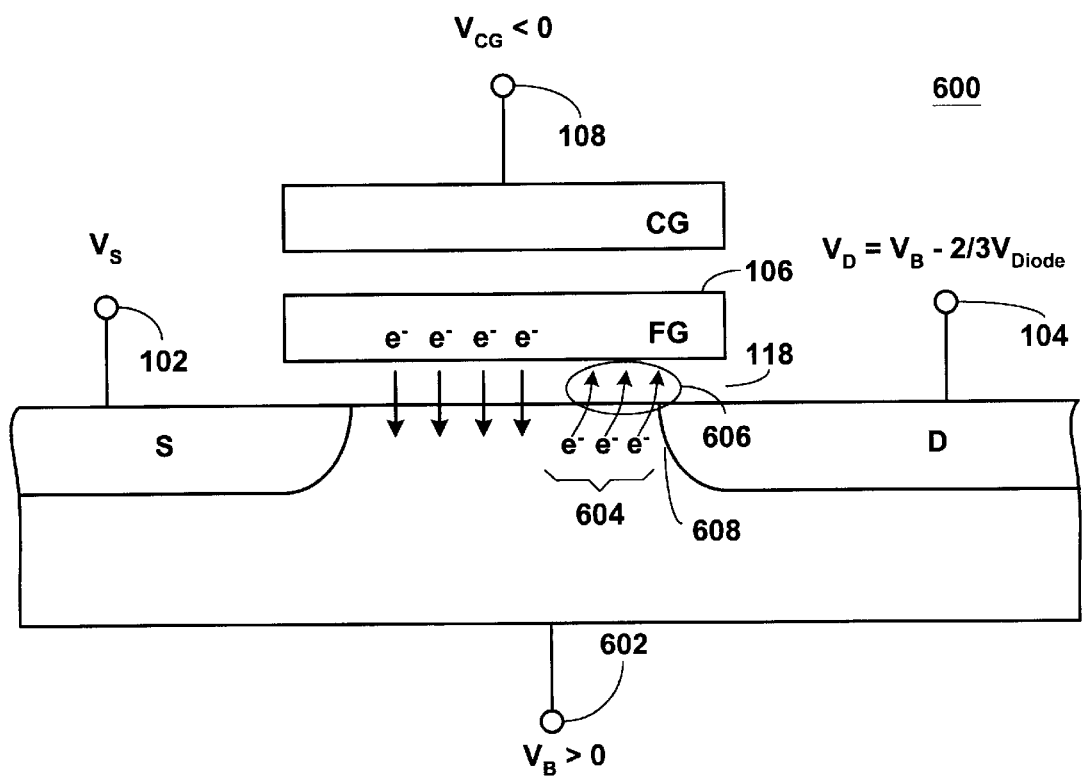
FIG. 6 shows the bias voltages applied to a flash memory cell during erase in order to suppress bi-directional tunnel oxide stress in accordance with the present invention.

FIG. 6 shows a flash memory cell 600 showing bias voltages applied to the drain 104, control gate 108 and substrate 602 during a channel erase procedure of the flash memory cell. As described above, during a conventional channel erase procedure, electrons will transition through the tunnel oxide 118 along the total length of the channel resulting in an overlap in the channel through which electrons transition the tunnel oxide 118 during programming. In accordance with the present invention, the flash memory cell is biased during channel erase so that the electrons transition the tunnel oxide towards the source so that there is no overlap of the tunnel oxide during programming.

Referring again to FIG. 6, the electrons shown at 604 are electrons that transition the tunnel oxide 118 during a programming procedure and it should be understood that these electrons are only shown for reference purposes only since the flash memory cell in FIG. 6 is being erased. The electrons shown at 604 transition the tunnel oxide 118 during programming in an area close to the drain region 104 indicated generally within the circle 606. Therefore, it would be advantageous for electrons that transition the tunnel oxide 118 during erase to not transition the tunnel oxide 118 inside the circle 606. To prevent electrons from transitioning the tunnel oxide 118 inside the circle 606 during erase, the flash memory cell is biased as follows. The conventional negative voltage is applied to the control gate 108 and a positive voltage $V_B$ is applied to the substrate 602. The source is floated and a bias voltage of $V_B - \frac{2}{3} V_{Diode}$ is applied to the drain 104 where $V_{Diode}$ is the diode voltage drop across the drain junction 608. The drain bias results in less voltage between the gate to drain than between gate to substrate or gate to source. Thus, the gate to drain electric field is reduced. Since the erase current occurs by Fowler-Nordheim tunneling that depends exponentially on the electric field, even a small reduction in the electric field will reduce the gate current dramatically. Therefore, there will be almost no gate current on the drain side of the device where the programming current occurs.

In summary, the present invention overcomes the limitations of the prior art and fulfills the need for a method to erase a flash memory cell that suppresses bi-directional tunnel oxide stress in the flash memory cell.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of erasing a flash memory cell to suppress bi-directional tunnel oxide stress in the flash memory cell that includes a substrate, a source formed in the substrate and a drain formed in the substrate thereby forming a drain junction, a layer of tunnel oxide formed on a surface of the substrate, a floating gate formed on the layer of tunnel oxide, a layer of dielectric formed on the floating gate and a control gate formed on the layer of dielectric, the method comprising:

applying a negative voltage to the control gate;

applying a bias voltage $V_B$ to the substrate; and applying a bias voltage $V_D$ to the drain that equals the bias voltage $V_B$ applied to the substrate minus a fraction of a diode voltage drop $V_{Diode}$ across the drain junction.

2. The method of claim 1 wherein the bias voltage $V_D$ is selected so that the drain junction is not forward biased.

3. The method of claim 2 wherein the fraction is in the range of 20% to 80%.

* * * * *